United States Patent
Wilson et al.

(10) Patent No.: US 6,195,376 B1
(45) Date of Patent: Feb. 27, 2001

(54) SEMICONDUCTOR LASER ARRAY STACK PACKAGE & METHOD OF FABRICATION

(75) Inventors: Stewart Wayne Wilson; Rushikesh M. Patel, both of Tucson, AZ (US)

(73) Assignee: Opto Power Corporation, Tucson, AZ (US)

( * ) Notice: Subject to any disclaimer, the term of this patent is extended or adjusted under 35 U.S.C. 154(b) by 0 days.

(21) Appl. No.: 09/189,756

(22) Filed: Nov. 10, 1998

Related U.S. Application Data

(63) Continuation-in-part of application No. 09/052,519, filed on Mar. 31, 1998, now Pat. No. 6,101,205.

(51) Int. Cl.[7] ............................... H01S 3/04; H01S 5/00
(52) U.S. Cl. .................................. 372/50; 372/36
(58) Field of Search .................... 372/50, 34, 35, 372/36; 385/89; 359/248; 29/877, 729, 739, 740, 757

(56) References Cited

U.S. PATENT DOCUMENTS

| | | | |
|---|---|---|---|
| 5,040,187 | * | 8/1991 | Karpinski .............................. 372/50 |
| 5,128,951 | * | 7/1992 | Karpinski .............................. 372/50 |

* cited by examiner

*Primary Examiner*—Frank G. Font
*Assistant Examiner*—Armando Rodriguez
(74) *Attorney, Agent, or Firm*—Herbert M. Shapiro

(57) ABSTRACT

Semiconductor laser diodes or diode bars are assembled into stacks by a method which permits testing of an entire stack at once and which uses only high temperature solder. The stack includes a plurality of submounts which resemble elongated bars which are square in cross section. Laser diodes (or diode bars) are sandwiched between adjacent submounts. Each submount has an elongated mesa and the mesas are so shaped and positioned in the stack to form a set of ridges which fit into a set of grooves in a substrate. The diodes are bonded to adjacent submounts in a stack simultaneously by reflowing solder preforms (high temperature) in a reflow oven. The stack is secured in place in the grooves of the substrate by reflowing solder placed at the bottom of the grooves.

7 Claims, 3 Drawing Sheets

SEMICONDUCTOR LASER ARRAY STACK PACKAGE & METHOD OF FABRICATION

REFERENCE TO RELATED APPLICATIONS

The present application is a continuation in part of application Ser. No. 09/052,519, filed Mar. 31, 1998 U.S. Pat. No. 6,101,205, and assigned to the Assignee of the present application.

FIELD OF THE INVENTION

This invention relates to semiconductor laser stacks and more particularly to a packaging arrangement for such stacks which permit the use of high temperature solder and the testing of entire assemblages rather than individual components prior to assembly.

BACKGROUND OF THE INVENTION

It is well known in the art to position laser diodes into slots formed in the surface of a ceramic substrate. One such arrangement is disclosed in U.S. Pat. Ser. No. 5,040,187 issued Aug. 13, 1991. Another such arrangement is disclosed in the above-noted U.S. Patent application.

The current state of the art in the implementation of either of the above-noted arrangements requires relatively low temperatures solder bonds to be made to secure laser diodes in the slots. Accordingly, increasingly lower temperature solders thereafter are used in the fabrication of laser packages in order to avoid deterioration of previously made bonds. Since device reliability is reduced as lower and lower temperature solders are used as they require the use of flux, solder specification considerations are important in device design and processing and high temperature solders that do not require flux are preferred.

BRIEF SUMMARY OF THE INVENTION

In accordance with the principles of this invention, a laser diode submount, generally in the shape of an elongated bar with a square cross section has an elongated mesa on one surface. The submount configuration permits an inexpensive assembly of a stack of diodes to be fabricated, one diode between each pair of submounts with the mesas forming a set of parallel ridges. The stack is formed into an integral unit by high temperature solder preforms between the diodes and the submounts. The diodes of the entire stack can be tested at a single time. The ridges are then inserted into a matching set of metallized parallel slots of an electrically-insulating substrate.

The volume of each slot and the volume of each ridge is important to insure maximum thermal conduction of heat generated during operation of the stack. The heat generated in operation moves towards a heat sink connected to the substrate and the cross sectional area for the heat transfer is increased by spreading solder between each submount and the associated slot during mounting and the difference between the volume of a ridge and the volume of a slot dictates the appropriate amount of solder to be used.

DETAILED DESCRIPTION OF ILLUSTRATIVE EMBODIMENTS OF THIS INVENTION

Figure 1:
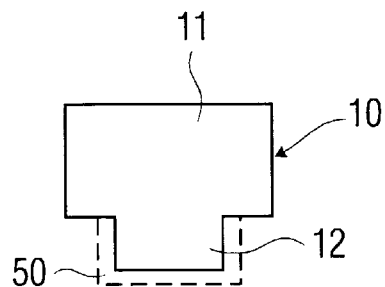
FIGS. 1 and 2 are end and side views of a submount component for a laser diode stack in accordance with the principles of this invention.
Figure 2:
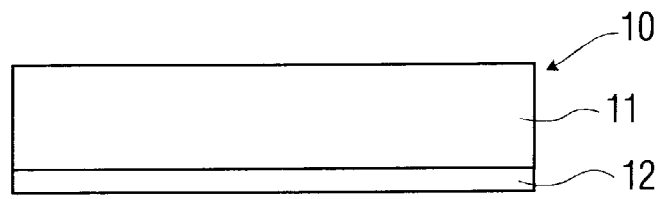

FIG. 1 shows an end view of an illustrative diode submount 10 which has the shape of a elongated bar with a mesa. The bar portion 11, has a relatively wide dimension (illustratively 0.047 inch). The mesa portion 12 has a relatively narrower dimension (illustratively 0.032 inch) as viewed. The vertical dimension of portion 11 illustratively is 0.051 inch and the vertical dimension of the second portion is 0.010 inch. The submount length is illustratively 0.394 inch long and is shown in FIG. 2.

The mesa portion of the submount may be visualized as a ridge extending along a first surface of the submount.

Figure 3:
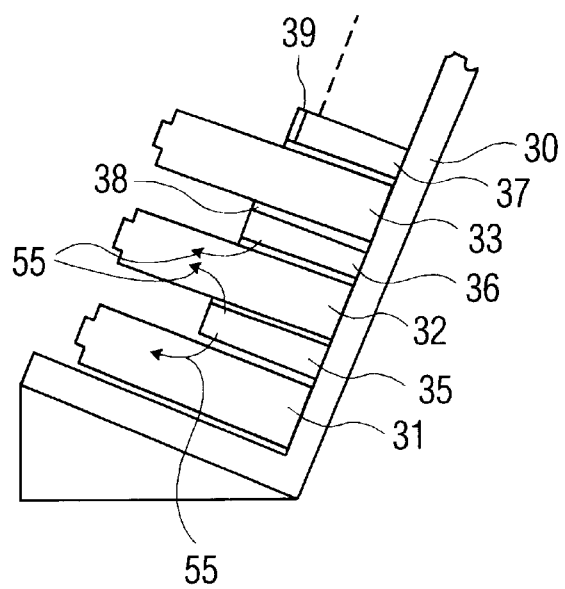
FIG. 3 is a schematic side view of a processing jig with a plurality of submounts of FIGS. 1 and 2 sandwiching laser diodes or laser diode bars therebetween.

FIG. 3 shows a side view of a jig 30 with a plurality of submounts 31, 32, 33 typically assembled in stacks of between ten and twenty for commercial use. The submounts are positioned in the jig one at a time with laser diode or laser diode bars (35, 36, and 37) positioned therebetween. The diodes are spaced apart from adjacent submounts by solder preforms shown at 38 and 39. The mesas (12) may be seen to form a plurality of parallel and spaced-apart ridges when the stack is formed.

Figure 4:
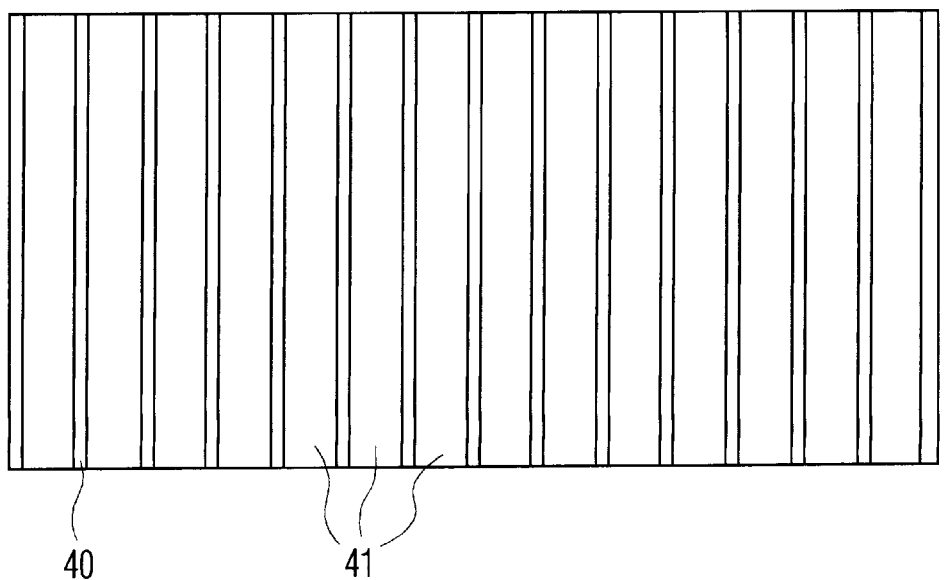
FIGS. 4 and 5 are top and side views of a substrate for receiving the plurality of submounts of FIG. 3 when assembled.
Figure 5:
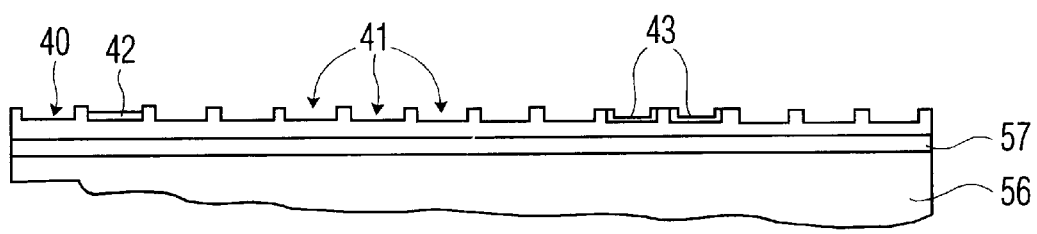

The stack, when assembled and tested, is mated with the metallized grooves of a grooved substrate shown in FIGS. 4 and 5. Specifically, FIGS. 4 and 5 show a substrate 40 illustratively having a long dimension of 0.782 inch and a short dimension of 0.39±0.002 inch as viewed in FIG. 4. The substrate has a thickness of 0.025 inch with grooves 41 0.010 inch deep as viewed in FIG. 5. The three side walls of grooves 41 are coated with metal shown only at 43 of FIG. 5). The set of ridges (12) of FIGS. 1 and 2, when the stack is assembled as shown in FIG. 3, are positioned to mate with grooves 41.

The bottoms of grooves 41 include a high temperature solder of 60 percent Sn-40 percent Pb. The solder preforms 38 and 39 of FIG. 3 are 80 percent Au-20 percent Sn which allows for fluxless assembly. The placement of the ridges of the laser diode stacks of FIG. 3 into the grooves 41 permits the entire assemblage to be formed into an integral structure. The use of a high temperature solder during the assembly of the laser stack ensures high reliability for the structure.

The amount of solder (shown only at 42 in FIG. 5) at the bottom of each groove advantageously is adequate to extend not only along the bottom of the mesa portion of each submount but also along the side walls of the mesa portion. The extent of the solder flow is indicated by the dashed line 50 in FIG. 1. The solder is a good thermal conductor. Thus, by providing sufficient solder at the bottom of the grooves to have the solder forced up to fill the space between each submount and the walls of the grooves, a relatively large cross sectional area is provided for removing the heat generated by the laser diodes. The path of the heat is indicated by arrows 55 in FIG. 3. The arrows can be seen to be directed towards the substrate (40) and the substrate is attached, also by solder 57, to a heat sink 56 as shown in FIG. 5. For the illustrative dimensions indicated, the amount of solder provided at the bottom of each groove is selected to fill the remaining volume of the groove (0.394"×0.043"× 0.003") and thus occupies the entire space indicated by dashed line 50 of FIG. 1.

Figure 6:
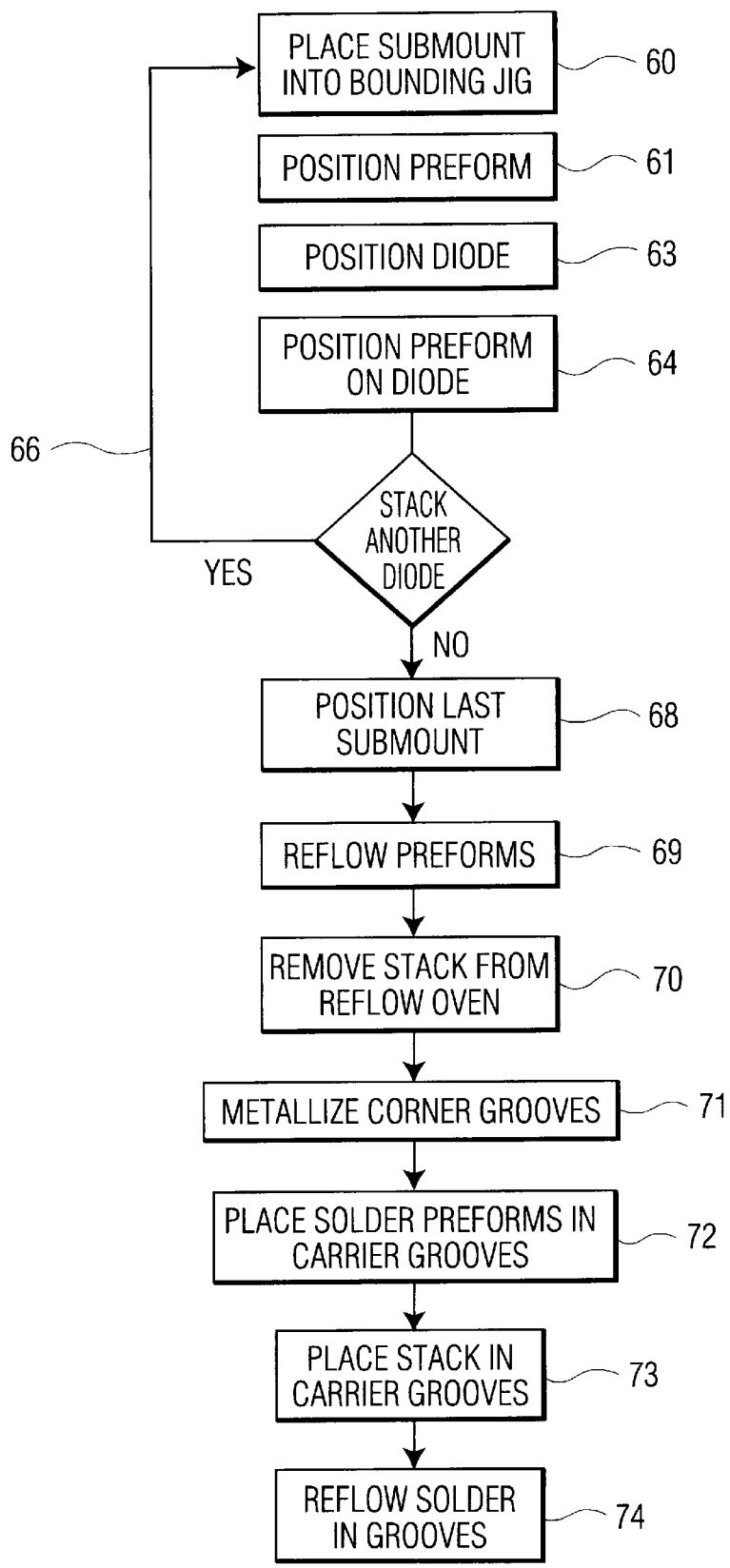
FIG. 6 is a flow diagram of the method of fabricating the laser stack of FIGS. 1–5.

FIG. 6 is a flow diagram of the method for fabricating the laser diode stack of FIGS. 1–5. The first step is the placement of a first submount (i.e. 31 of FIG. 3) into the bonding jig as indicated by block 60 of FIG. 6. The next step is the placement of a solder preform on the submount as indicated by block 61. A laser diode (or diode bar) such as 35 of FIG. 3, is placed on the solder preform and another solder preform is placed on top of the diode. These steps are represented by blocks 63 and 64.

A decision is made at this juncture as to whether or not another laser diode is to be placed in the stack. If yes, the procedure returns to block 60 as indicated by arrow 66. If not, the last submount is positioned as indicated by block 68. The stack is then placed in an oven and a weight is placed on the stack to reflow the solder preforms as indicated by block 69.

The stack is then removed from the oven as indicated by block 70. The grooves of the carrier are metallized and solder is placed in the grooves as indicated by blocks 71 and 72. The stack is then placed into the grooves as indicated by block 73. The solder is then reflowed in the reflow oven as indicated by block 74.

The substrate is made, illustratively, of either beryllium oxide, aluminum nitride, sapphire, diamond or aluminum oxide ceramic material and is bonded to a heat sink which may be any standard heat sink such as a solid metal block or a microchannel cooler.

What is claimed is:

1. The method of fabricating an integral stack of laser diodes, said method comprising the steps of assembling a plurality of electrically conducting submounts in a bonding jig with a laser diode sandwiched between each pair of adjacent submounts where each submount has a relatively narrow ridge portion extending therefrom, placing solder preform between each submount and an adjacent laser diode, heating the stack under pressure at a temperature for a time to form an integral stack with said ridges extending in a like direction and forming a plurality of parallel and spaced apart ridges, metallizing each of a plurality of grooves in an electrically insulating carrier having a plurality of grooves to correspond to said ridges, placing solder in each of said grooves, mating the stack with said carrier, and heating the assemblage for a time under pressure to bond the stack to the carrier.

2. The method of claim 1 also including the step of placing in each of said grooves a sufficient amount of solder to occupy the space between each of said ridges and the associated groove along the bottom and the side walls of each of said ridges.

3. The method of claim 1 wherein said carrier comprises BeO.

4. The method of claim 1 also including the step of bonding said carrier to a heat sink.

5. A laser diode stack, said stack comprising a plurality of electrically conducting submounts, said stack including a laser diode between each pair of adjacent ones of said submounts, each of said submounts including a relatively narrow elongated mesa extending from a first surface thereof and forming a plurality of spaced apart and parallel ridges extending from said stack, said stack also including an electrically insulating and thermally conductive carrier, said carrier including a plurality of metallized grooves mating with said plurality of ridges and forming an integral structure therewith.

6. An assemblage of laser diodes, said assemblage comprising a plurality of laser diode submounts, each of said submounts comprising an electrically-conducting material and having first and second portions, said first portion having a lateral dimension small compared to that of said second portion and forming a mesa, said assemblage including a laser diode between the second portions of the submounts of each pair of adjacent submounts, said assemblage also including a electrically insulating and thermally conducting substrate, said substrate including at a first surface thereof a plurality of parallel grooves, each of said grooves having a lateral dimension and being spaced-apart distances to correspond to the positions of said mesas in said stack, each of said grooves being metallized and including solder filling the space between each ridge and the corresponding one of said grooves.

7. As assemblage as in claim 6 wherein said substrate comprises BeO.

* * * * *